(12) United States Patent
Otremba et al.

(10) Patent No.: US 9,230,889 B2
(45) Date of Patent: Jan. 5, 2016

(54) CHIP ARRANGEMENT WITH LOW TEMPERATURE CO-FIRED CERAMIC AND A METHOD FOR FORMING A CHIP ARRANGEMENT WITH LOW TEMPERATURE CO-FIRED CERAMIC

(71) Applicant: Infineon Technologies AG, Neubiberg (DE)

(72) Inventors: Ralf Otremba, Kaufbeuren (DE); Marco Seibt, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 13/742,426

(22) Filed: Jan. 16, 2013

(65) Prior Publication Data
US 2014/0197523 A1   Jul. 17, 2014

(51) Int. Cl.
*H01L 23/29*   (2006.01)
*H01L 23/373*   (2006.01)
(Continued)

(52) U.S. Cl.
CPC ............ *H01L 23/495* (2013.01); *H01L 21/56* (2013.01); *H01L 23/295* (2013.01); *H01L 23/3731* (2013.01); *H01L 23/4334* (2013.01); *H01L 23/49575* (2013.01); H01L 23/3107 (2013.01); H01L 24/29 (2013.01); H01L 24/32 (2013.01); H01L 24/48 (2013.01); H01L 24/73 (2013.01); H01L 2224/04042 (2013.01); H01L 2224/291 (2013.01); H01L 2224/2919 (2013.01); H01L 2224/29147 (2013.01); H01L 2224/32225 (2013.01); H01L 2224/32245 (2013.01); H01L 2224/48137 (2013.01); H01L 2224/48247 (2013.01); H01L 2224/73265 (2013.01); H01L 2924/1033 (2013.01); H01L 2924/10253 (2013.01); H01L 2924/10272 (2013.01); H01L 2924/12032 (2013.01); H01L 2924/1301 (2013.01); H01L 2924/1305 (2013.01); H01L 2924/1306 (2013.01); H01L 2924/13034 (2013.01); H01L 2924/13055 (2013.01); H01L 2924/13091 (2013.01);
(Continued)

(58) Field of Classification Search
CPC ... H01L 23/295; H01L 23/34; H01L 23/3731; H01L 23/48
See application file for complete search history.

(56) References Cited

U.S. PATENT DOCUMENTS 6,674,159 B1 * 1/2004 Peterson et al. .............. 257/680
7,683,477 B2   3/2010 Otremba
(Continued)

FOREIGN PATENT DOCUMENTS

DE   102008008515 A1   9/2008
DE   102008025451 A1   12/2008
(Continued)

OTHER PUBLICATIONS http://de.wikipedia.org/wiki/Low_Temperature_Cofired_Ceramics, pp. 1-3, Jan. 17, 2013.
(Continued)

*Primary Examiner* — Thanh V Pham (57) ABSTRACT

A chip arrangement is provided, the chip arrangement, including: a carrier; at least one chip including at least one contact pad disposed over the carrier; an encapsulation material at least partially surrounding the at least one chip and the carrier; and at least one low temperature co-fired ceramic sheet disposed over a side of the carrier.

17 Claims, 6 Drawing Sheets

(51) Int. Cl.
  *H01L 23/495* (2006.01)
  *H01L 21/56* (2006.01)
  *H01L 23/433* (2006.01)
  *H01L 23/31* (2006.01)
  *H01L 23/00* (2006.01)

(52) U.S. Cl.
  CPC .......... *H01L 2924/1431* (2013.01); *H01L 2924/1433* (2013.01); *H01L 2924/1434* (2013.01); *H01L 2924/15747* (2013.01)

(56) References Cited

U.S. PATENT DOCUMENTS

| | | | |
|---|---|---|---|
| 7,868,465 | B2 | 1/2011 | Otremba et al. |
| 8,077,475 | B2 | 12/2011 | Otremba |
| 8,093,713 | B2 | 1/2012 | Otremba et al. |
| 8,324,653 | B1 | 12/2012 | Lin et al. |
| 2001/0050422 | A1 | 12/2001 | Kishimoto et al. |
| 2002/0012762 | A1 | 1/2002 | Bunyan |
| 2003/0122232 | A1 | 7/2003 | Hirano et al. |
| 2003/0213979 | A1 | 11/2003 | Nakajima et al. |
| 2004/0061206 | A1 | 4/2004 | Son et al. |
| 2005/0067719 | A1 | 3/2005 | Hayashi et al. |
| 2006/0165978 | A1 | 7/2006 | Ito et al. |
| 2007/0277873 | A1 | 12/2007 | Cornfeld et al. |
| 2009/0083963 | A1 | 4/2009 | Otremba |
| 2010/0140718 | A1 | 6/2010 | Sato et al. |
| 2010/0277873 | A1 | 11/2010 | Eisele et al. |
| 2012/0211899 | A1 | 8/2012 | Imaizumi et al. |
| 2014/0197523 | A1 | 7/2014 | Otremba et al. |
| 2014/0197527 | A1 | 7/2014 | Mengel et al. |

FOREIGN PATENT DOCUMENTS

| | | |
|---|---|---|
| DE | 102008023127 A1 | 1/2009 |
| DE | 102008046728 A1 | 5/2009 |
| EP | 0526063 A1 | 2/1993 |

OTHER PUBLICATIONS e-Front runners, Power Electronics M-Power2B series A multi chip power device for a Multi-Oscillated Current Resonant type Converter, Apr. 2009, pp. 1-2; http://www.fujielectric.com/products/semiconductor/products/new/2009/pdf/09070108.pdf.

Saechtling, "Kunststoff-Taschenbuch", Carl Hanser Verlag, 27. Edition, 1998, pp. 140-141.

http://books.google.com/books?id=6pfZdxGLMY0C&q=porosity#v=snippet&q=porosity&f=false (Rice, R., Porosity of ceramics, Materials Engineering, 1998, p. 10, Marcel Dekker Inc., New York).

http://www.sv.vt.edu/classes/MSE2094_NoteBook/97ClassProj/exper/gordon/www/ceramic.html, Mar. 12, 2015, 4 pages.

http://www.induceramic.com/porous-ceramics-application/thermal-insulation-application, Mar. 13, 2015, 6 pages.

Final Office Action received for the cross-citing U.S. Appl. No. 13/742,455, mailed Mar. 20, 2015, 31 pages.

* cited by examiner

CHIP ARRANGEMENT WITH LOW TEMPERATURE CO-FIRED CERAMIC AND A METHOD FOR FORMING A CHIP ARRANGEMENT WITH LOW TEMPERATURE CO-FIRED CERAMIC

TECHNICAL FIELD

Various embodiments relate generally to a chip arrangement and a method for forming a chip arrangement.

BACKGROUND

Figure 1A:
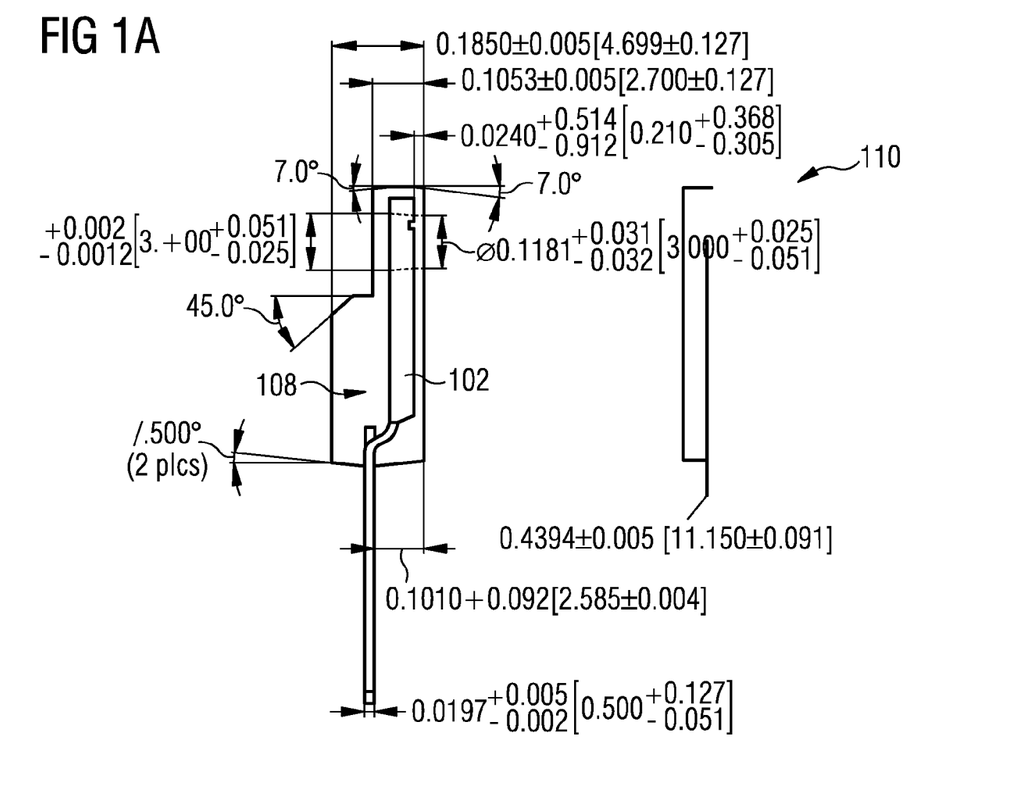
FIGS. 1A and 1B show a multi-chip package.
Figure 1B:
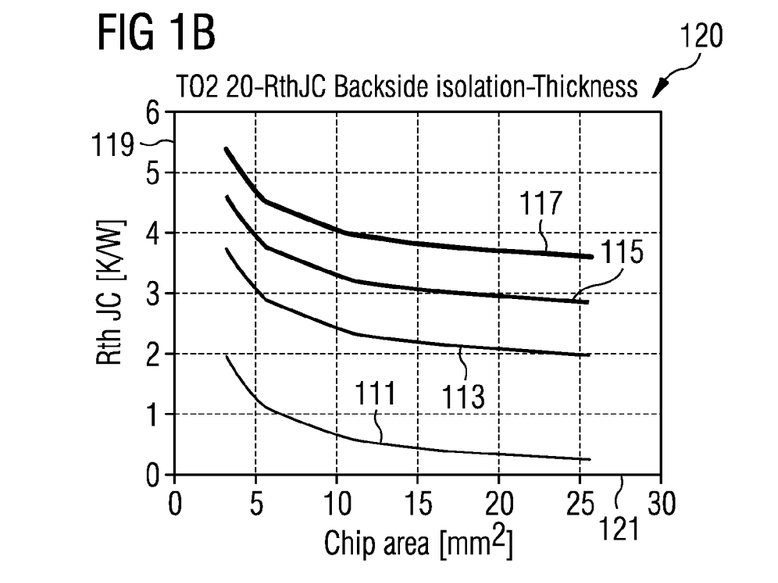

FIG. 1A shows an illustration of heatsink-isolation based on molding. A chip package, e.g. a transistor outline TO chip package, may include a back side isolation, e.g. an encapsulation material formed over a back side of a leadframe 102 as indicated by 108. Back side isolations, having typical thicknesses, may result in a worse heat dissipation performance than a TO chip package without a back side isolation. FIG. 1B shows the thermal resistance 119 (K/W) with respect to chip area 121 (mm$^2$) of a chip package with different back side isolation thicknesses: no back side isolation 111; about 500 µm thick back side isolation 113; about 600 µm thick back side isolation 115; and about 800 µm thick back side isolation 117. Typical encapsulation thicknesses of the back side isolation, which are normally around 500 µm, e.g. as shown by 113, suffer from a much larger thermal resistance than chip packages without back side isolation, e.g. as shown by 111, and therefore exhibit poorer heat dissipation than without back side isolation.

Low temperature co-fired ceramic (LTCC) technology may combine the benefits of HTCC (High Temperature Co-fired Ceramics) and thick-film technology which may have traditionally been used in conventional printed circuit board (PCB) technology. Low Temperature Co-fired Ceramics may be used for multi-sheet/multi-layer circuit arrangements. Components such as capacitors, resistors and inductors may be produced using single layer or multi layer LTCC sheets, e.g. by printing, e.g. by screen printing and/or photochemical processes. LTCC sheets may be suitable for imprinting with resistors and/or other electronic components. For example, with a screen printing process, conductive pastes may be printed on the LTCC surface, which generate the resistors and/or electronic components necessary for the circuits. Such electronic components may differ from all of their nominal values (±25%) and may therefore be too large print. With the laser trimming and using different cutting styles, resistors and/or electronic components may be trimmed until they reach their exact resistance values (±1%). LTCC sheets may also be used in the field of microfluidics, wherein instead of glass substrates, three-dimensional structures may be constructed.

LTCC sheets may have a relatively poor thermal conductivity compared to aluminum oxide (thick-film technology), and are therefore often used with thermal vias. LTCC sheets may be used in applications such as high-frequency wireless, satellite, microwave systems and medical technology and the automotive industry (steering).

SUMMARY

Various embodiments provide a chip arrangement, including: a carrier; at least one chip including at least one contact pad disposed over the carrier; an encapsulation material at least partially surrounding the at least one chip and the carrier; and at least one low temperature co-fired ceramic sheet disposed over a side of the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 2:
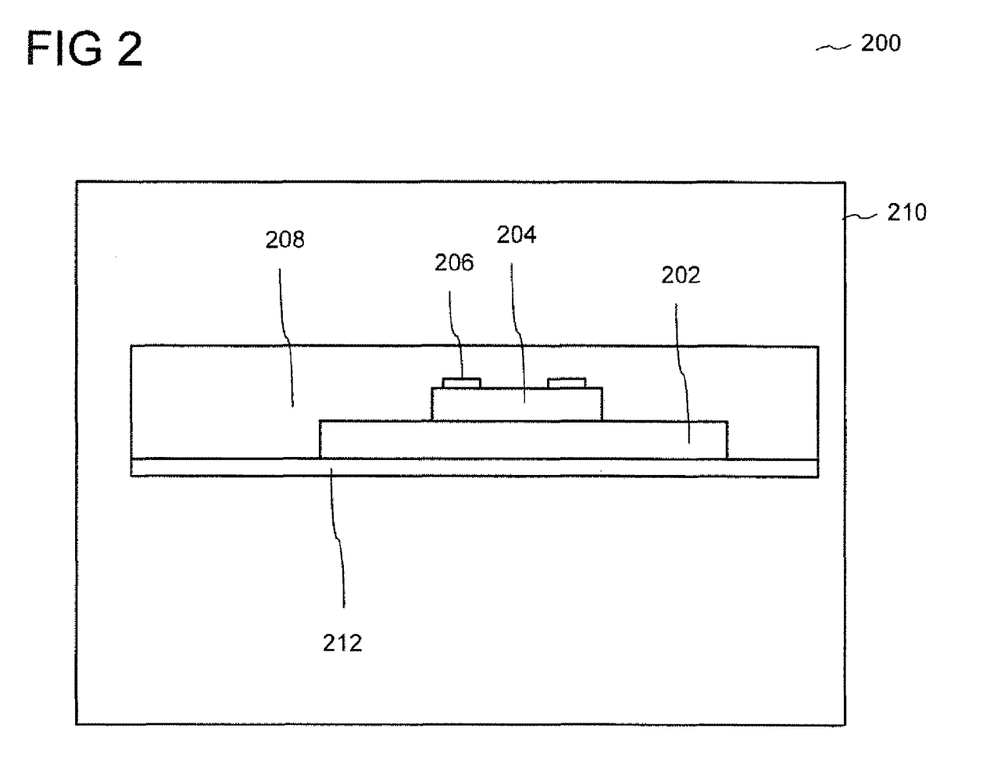
FIG. 2 shows a chip arrangement according to an embodiment.

FIG. 2 shows chip arrangement 210 according to an embodiment.

Chip arrangement 210 may include: carrier 202; at least one chip 204, e.g. a semiconductor die, including at least one contact pad 206 disposed over carrier 202; encapsulation material 208 at least partially surrounding at least one chip 204 and carrier 202; and at least one low temperature co-fired ceramic (LTCC) sheet 212 disposed over a side of carrier 202.

Figure 3A:
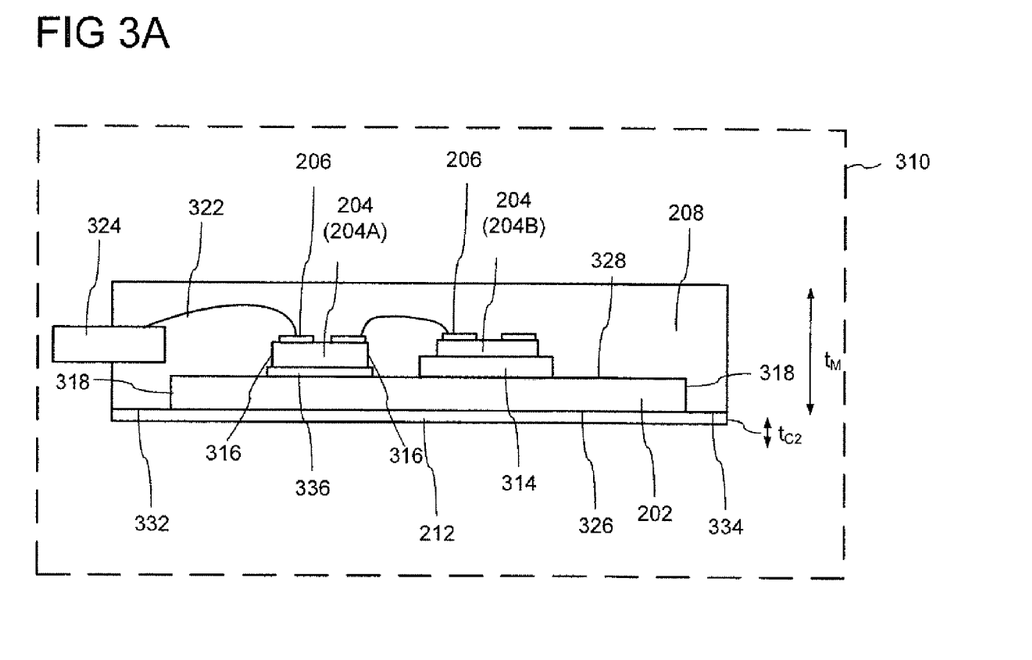
FIGS. 3A-3D show a chip arrangement according to an embodiment.

FIG. 3A shows chip arrangement 310 according to an embodiment.

Chip arrangement 310 may include: carrier 202. Carrier 202 may include at least part of a lead frame. Carrier 202 may include a lead frame material, the lead frame material including at least one from the following group of materials, the group of materials consisting of: copper, nickel, iron, copper alloy, nickel alloy, iron alloy. Carrier 202 may be configured to hold or carry the chip and may include for example a heat spreader. Carrier 202 may include a thickness ranging from about 0.5 mm to about 3 mm, e.g. about 1 mm to about 2 mm.

At least one chip 204 including at least one contact pad 206 may be disposed over carrier 202. At least one chip 204 may include at least one of a power semiconductor chip, a semiconductor logic chip and a semiconductor memory chip.

Chip arrangement 210 may include, e.g. a first chip 204A which may include a semiconductor logic chip, wherein the semiconductor logic chip may include at least one semiconductor logic device from the group consisting of: an application specific integrated circuit chip, a driver, a controller, a sensor.

Chip arrangement 210 may include, e.g. a second chip 204B, which may include a power semiconductor chip, wherein the power semiconductor chip may include at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

At least one chip 204 may include a plurality of chips, e.g. one or two or more chips, e.g. chips 204A, 204B. At least one chip 204 may be adhered to carrier 202, e.g. via an adhesive, e.g. via solder material. For example, at least one chip, e.g. chip 204B, which may require an electrically conductive back side may be electrically connected via its back side to carrier 202, for example, via an electrically conductive medium 314, e.g. an electrically conductive adhesive and/or an electrically conductive solder material.

Encapsulation material 208 may be disposed over at least one chip 204, wherein encapsulation material 208 may at least partially surround at least one chip 204 and carrier 202. Encapsulation material 208 may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

Encapsulation material 208 may be formed over at least one chip 204 and over one or more sidewalls 316 of at least one chip. Furthermore, encapsulation material 208 may be formed over at least one chip 204 and over one or more sidewalls 318 of carrier 202. At least one wire 322 may be electrically connected to at least one contact pad 206, and encapsulation material 208 may at least partially surrounds at least one wire 322. At least one wire 322 may further be electrically connected to a lead frame 324, e.g. by wire bonding.

Encapsulation material 208 may have a thickness $t_M$ ranging from about 10 μm to about 300 μm, e.g. about 20 μm to about 200 μm, e.g. about 30 μm to about 100 μm.

Before deposition of at least one low temperature co-fired ceramic sheet 212 over a side of carrier 202, e.g. over carrier bottom side 326, the side of carrier 202 onto which at least one low temperature co-fired ceramic sheet 212 may be disposed may be subject to a roughening process, to improve adhesion of at least one low temperature co-fired ceramic sheet 212 to said side of carrier, i.e. carrier bottom side 326.

At least one low temperature co-fired ceramic sheet (LTCC) 212 may be disposed over a side of carrier 202. Furthermore, at least one low temperature co-fired ceramic sheet 212 may physically contact encapsulation material 208. Each ceramic sheet may include a thickness ranging from about 0.01 mm to about 10 mm, e.g. about 0.1 mm to about 5 mm, e.g. about 0.1 mm to about 1 mm.

At least one low temperature co-fired ceramic sheet 212 may be disposed on carrier bottom side 326, carrier bottom side 326 being opposite to side 328 over which chip 204 may be disposed. At least one low temperature co-fired ceramic sheet 212 may include one or more low temperature co-fired ceramic sheets, e.g. single-sheet or multi-sheet. A multi-sheet arrangement is shown in FIG. 3D. At least one low temperature co-fired ceramic sheet 212 may further be disposed on at least one side of encapsulation material 208, e.g. 332, e.g. 334, wherein at least one side, e.g. 332, e.g. 334, of encapsulation material 208 may be substantially adjacent to carrier bottom side 326. At least one side, e.g. 332, e.g. 334, of encapsulation material 208 may be substantially level with and may abut carrier bottom side 326. At least one side e.g. 332, e.g. 334 of encapsulation material 208 may lie substantially parallel to carrier bottom side 326. At least one side e.g. 332, e.g. 334 of encapsulation material 208 may lie on a substantially level plane as carrier bottom side 326. Therefore, at least one low temperature co-fired ceramic sheet 212 may be deposited over carrier bottom side 326 and directly onto at least one side e.g. 332, e.g. 334 of encapsulation material 208 in a single deposition process.

Disposing at least one low temperature co-fired ceramic sheet 212 over a side of carrier 202 may include arranging one or more organic-ceramic tapes and/or sheets and/or foils over the desired location on carrier 202. The organic-ceramic tape and/or sheet may include, for example, ceramic particles, glass and metal, and/or other organic materials.

The one or more organic-ceramic tape and/or sheet may be arranged over carrier, and multiple tape and/or sheets may be further arranged, e.g. stacked and/or laminated together if necessary. Lamination may take place using heat and pressure processes, e.g. LTCC sheets 212 may be stacked, e.g. in a mold, laminated, and heated to a range of about 70° C. to about 80° C. under a pressure ranging from about 10 N/mm$^2$ to 30 N/mm$^2$ Cut after lamination to final size. Then the stacked arrangement of LTCC sheets may be structured, e.g. cut, to the required dimensions.

Firing and/or co-firing may subsequently be carried out, wherein the one or more organic-ceramic tape and/or sheet may be co-fired. The co-firing process may include heating the one or more organic-ceramic tape and/or sheet and carrier 202 up to a temperature, such that ceramic particles, metals and glass may be sintered together. Sintering processes used for the fabrication of LTCC sheets may be used, for example, the co-firing may make use of existing thick film printing technologies. The composition of ceramics may be provided with plastics and solvents to allow lamination under pressure and temperature processes. By co-firing, the organics may be burnt away. The firing temperature may range from about 800° C. to about 875° C., depending on the temperature required for the ceramic particles and glass to sinter. The co-firing profile may be adjusted. For example, co-firing for approximately one hour at approximately 350° C. may result in up to 85% of the organics being burnt away. Then co-firing may be carried out, e.g. in a normal thick-film oven, using a sintering profile which may burn the LTCC at 850° C. to 900° C. LTCC sheet 212 may experience shrinkage as a result of co-firing. It may also be possible for holes and/or vias to be formed, e.g. via laser structuring e.g. drilling, punching, and electrically conductive traces and/or interconnects may be formed through LTCC sheet 212 and in the holes and/or vias. Pastes for interconnects may be formed in the vias and after drying, conductor tracks may be printed. The interconnects, e.g. include silver, gold, palladium pastes, may match the shrink rate of the dimensions of the ceramic layer. The outermost layers of the LTCC sheet arrangement 212 may be post-fired if necessary to ensure extreme accuracy of fit for automated assembly of the sheets. Further deposition of electrically conductive material, e.g. by printing, may be carried out on the LTCC sheet arrangement after drying. It may be understood that the shrinkage of LTCC sheets during co-firing may be reproducible with about 1% tolerance if the temperature curve in the kiln is repeated exactly. The electrical properties of the tracks may correspond to the normal thick-film conductors.

At least one low temperature co-fired ceramic sheet 212 may include ceramic particles and glass particles sintered together, wherein at least one low temperature co-fired ceramic sheet 212 may be sintered onto and/or joined to side 326 of carrier 202. The glass may include alumoborosilicate glass. The ceramic particles include aluminum oxide. The metals may include at least one from the following group of materials, the group of materials consisting of: copper, silver, palladium, gold, platinum.

According to various other embodiments, the LTCC sheets 212, e.g. multi-sheets, may optionally be pre-sintered together before the co-firing process. Distinguishable boundaries may exist between each layer in the stacked arrangement (See FIG. 3D). According to various embodiments, instead of using low temperature co-fired ceramic sheets, high temperature co-fired ceramic (HTCC) sheets may be used instead.

Chip arrangement 310 may further include at least one further low temperature co-fired ceramic sheet 336 disposed between at least one chip 204, e.g. first chip 204A, and carrier 202. Further low temperature co-fired ceramic sheet 336 may be analogous to low temperature co-fired ceramic sheet 212 and may be disposed over carrier 202, e.g. side 328 of carrier 202 similarly to how low temperature co-fired ceramic sheet 212 may be disposed over carrier, e.g. using co-firing. Further low temperature co-fired ceramic sheet 336 may be at least partially or fully surrounded by encapsulation material 208. Further low temperature co-fired ceramic sheet 336 may function as an electrically insulating medium between chip 204, e.g. first chip 204A, and carrier 202. Co-firing of further low temperature co-fired ceramic sheet 336 may optionally be carried together with co-firing of low temperature co-fired ceramic sheet 212.

Figure 3B:
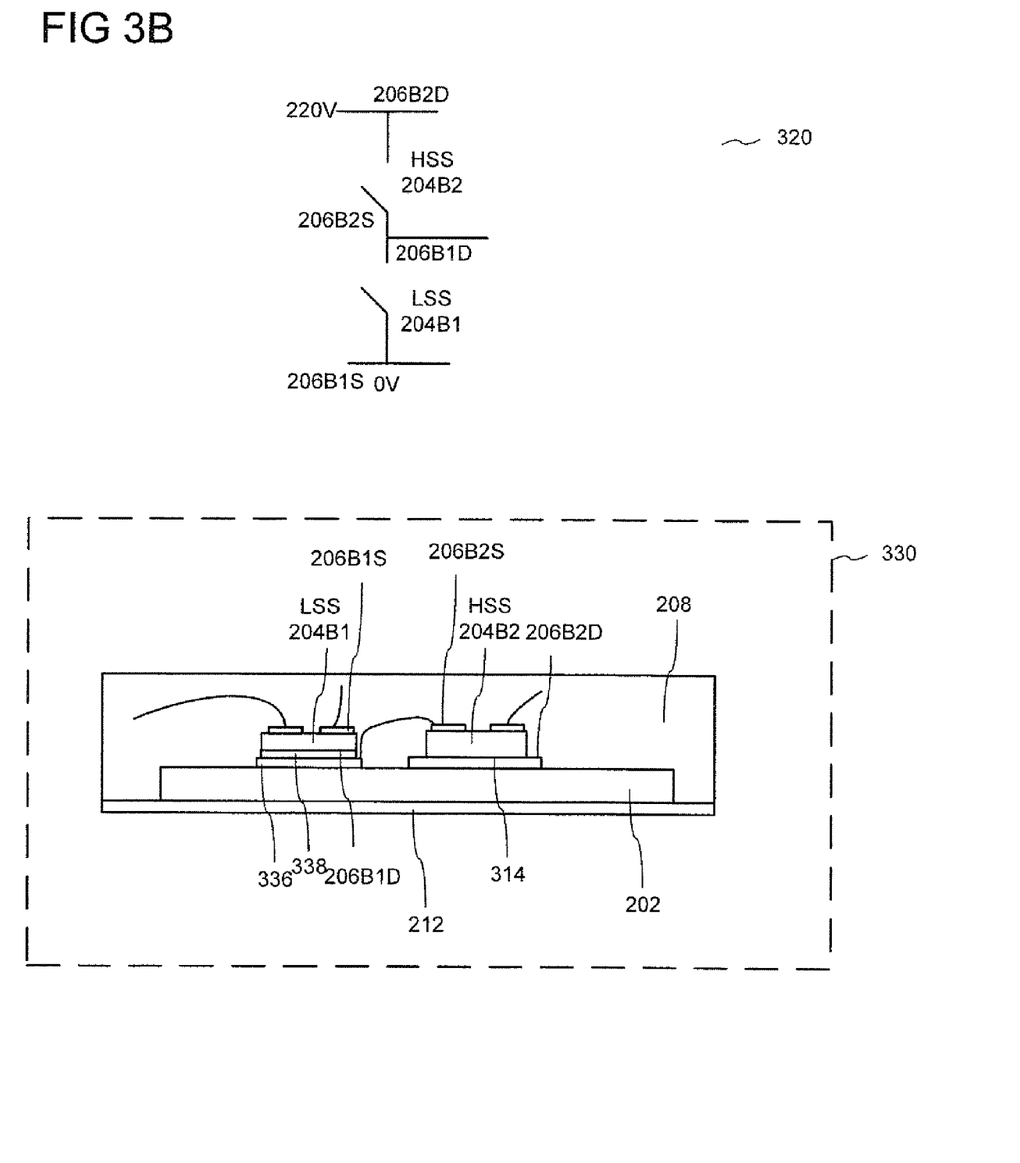

According to other embodiments, further low temperature co-fired ceramic sheet 336 may be used in combination with a further electrically conductive layer 338 as redistribution layers for a multi-chip module as shown in FIG. 3B.

As shown in FIG. 3B, chip arrangement 310 may be modified to chip arrangements 320, 330, wherein chip arrangements 320, 330 may include at least one chip 204 in half-bridge circuit arrangement. Chip arrangements 320, 330 may include a first power chip 204B1 and second power chip 204B2 arranged in a half-bridge circuit arrangement.

Further low temperature co-fired ceramic sheet 336 may be formed between i.e. disposed between, at least one chip 204, e.g. first power chip 204B1, and carrier 202. Further electrically conductive layer 338, e.g. a metal layer, e.g. a copper layer, may be disposed over further low temperature co-fired ceramic sheet 336. Further electrically conductive layer 338 may be electrically connected to drain contact 206B1D of first power chip 204B1 formed at first power chip back side. Source contact 206B1S of first power chip 204B1 may be formed at first power chip front side, and may for example, be connected to ground. First power chip 204B1 may be electrically insulated from carrier 202 due to the electrically insulating properties of further low temperature co-fired ceramic sheet 336 formed between first power chip 204B1 and carrier 202. Drain contact 206B1D may be electrically connected, e.g. via a wire, and further electrically conductive layer 338, to source contact 206B2S for second power chip 204B2, which may be formed over a front side of chip 204B2. Second power chip 204B2 may be electrically connected via its back side contact 206B2D to carrier 202, which may be connected to a voltage required to power the circuit, e.g. 220 V.

At least one low temperature co-fired ceramic sheet 212 may include a different material from encapsulation material 208, and may be up to 10 times more expensive as copper carriers, e.g. carrier 202. However, at least one low temperature co-fired ceramic sheet 212 may include a material with a lower thermal resistance than encapsulation material 208, e.g. 10 to 20 W/mK compared to 1 to 2 W/mk in encapsulation material 208. As a result, a thinner chip package back side isolation material may be used in the form of at least one low temperature co-fired ceramic sheet 212 in comparison with usual mold compound isolation material, e.g. similar to encapsulation material 208, formed over chip package back side, which may exhibit poor heat dissipation properties. Furthermore, at least one low temperature co-fired ceramic sheet 212 may be stable up to temperatures of about 300° C. to about 400° C., unlike traditional mold compounds with stability up to about 100° C. to about 200° C.

It may be understood that chip arrangement 310 may include a chip package, e.g. an electrically isolated chip package. Chip arrangement 310 may include for example a standard housing, e.g. TO-220, e.g. TO-247, which may include chip 204 disposed over carrier 202, e.g. a copper leadframe. At least one low temperature co-fired ceramic sheet 212 may be included in the chip package, wherein at least one low temperature co-fired ceramic sheet 212 may be coated and/or sintered with carrier 202.

Chip arrangement 310 may further undergo a separating process in order to finalize the chip package, wherein if required, dicing through at least one of encapsulation material 208, carrier 202 and at least one low temperature co-fired ceramic sheet 212 may be carried out.

Figure 3C:
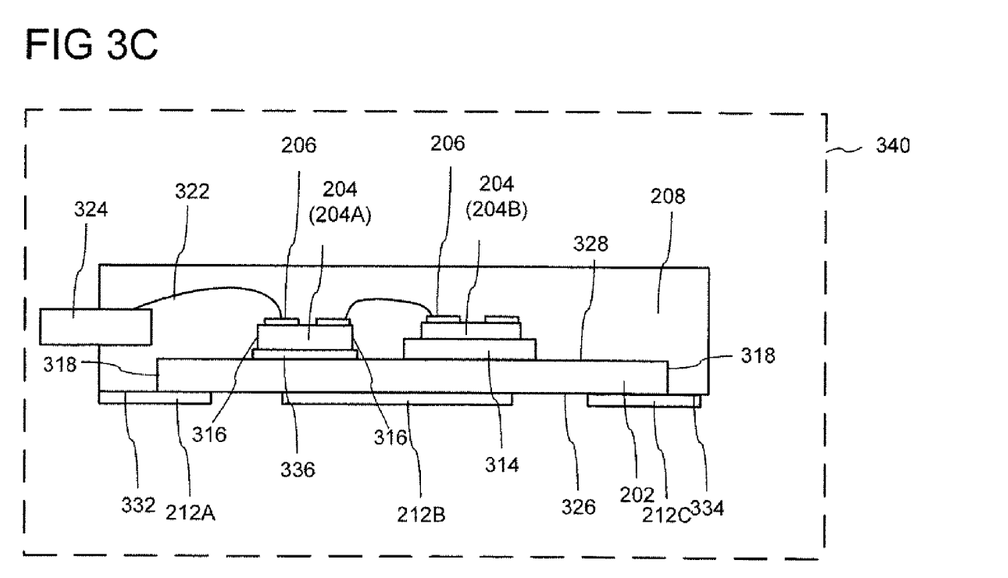
Figure 3D:
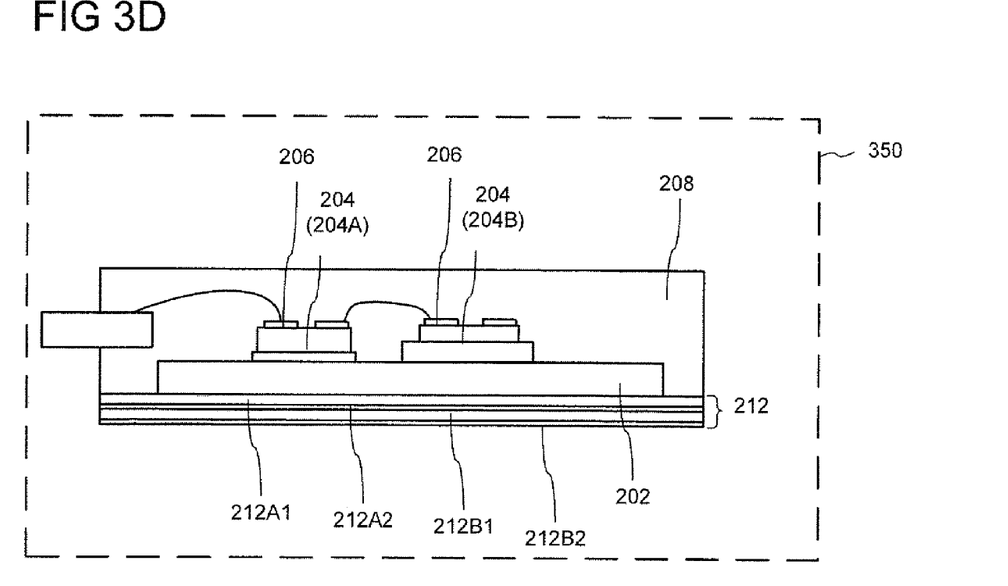

FIG. 3C shows chip arrangement 340 according to an embodiment. According to various embodiments, chip arrangements 310, 320, 330 may include at least one low temperature co-fired ceramic sheet 212 disposed over carrier 202. Up till now, LTCC sheet 212 has been shown to be a single continuous sheet. In chip arrangement 340, LTCC sheet 212 as shown may include one or more discontinuous low temperature co-fired ceramic sheets 212A, 212B, 212C disposed over carrier 202 and/or encapsulation material 208. Each of the one or more low temperature co-fired ceramic sheets 212A, 212B, 212C may be disposed over a portion of carrier 202 and/or encapsulation material 208. Each of the one or more low temperature co-fired ceramic sheets 212A, 212B, 212C may be separated from each other by a gap. Alternatively, each of the one or more low temperature co-fired ceramic sheets 212A, 212B, 212C may be arranged substantially adjacent to each other.

FIG. 3D shows chip arrangement 350 according to an embodiment, wherein chip arrangement 350 may include at least one low temperature co-fired ceramic sheet 212 disposed over carrier 202, wherein at least one low temperature co-fired ceramic sheet 212 may include a multi-sheet stacked arrangement. According to various embodiments, the LTCC sheets 212, e.g. multi-sheets, may optionally be pre-sintered together before the co-firing process, or may be sintered together during the co-firing process for joining the LTCC sheets to carrier 202.

Chip arrangement 350 shows a multi-LTCC sheet stacked arrangement 212, which may include a first LTCC sheet 212A1 and a second LTCC sheet 212B1. At least one interface layer, e.g. interface 212A2, may be formed between the sheets 212A1, 212B1. For example, due to heating and cooling, first LTCC sheet 212A1 may be cooled, thereby an interface layer, e.g. interface 212A2, may form on its surface. Subsequent heating and cooling of second LTCC sheet 212B1, which may be formed over first LTCC sheet 212A1, may result in a further interface layer, e.g. interface 212B2 formed on the surface of second LTCC sheet 212B1.

According to other embodiments multi-LTCC sheet stacked arrangement 212 may include at least one metallization layer and/or sheet (not shown) disposed between first LTCC sheet 212A1 and second LTCC sheet 212B1. Subsequent sintering, e.g. co-firing may result in the sintering of the at least one metallization layer and/or sheet between the LTCC sheets, e.g. between first LTCC sheet 212A1 and second LTCC sheet 212B, and the sintering of stacked arrangement 212 to carrier 202.

Figure 4:
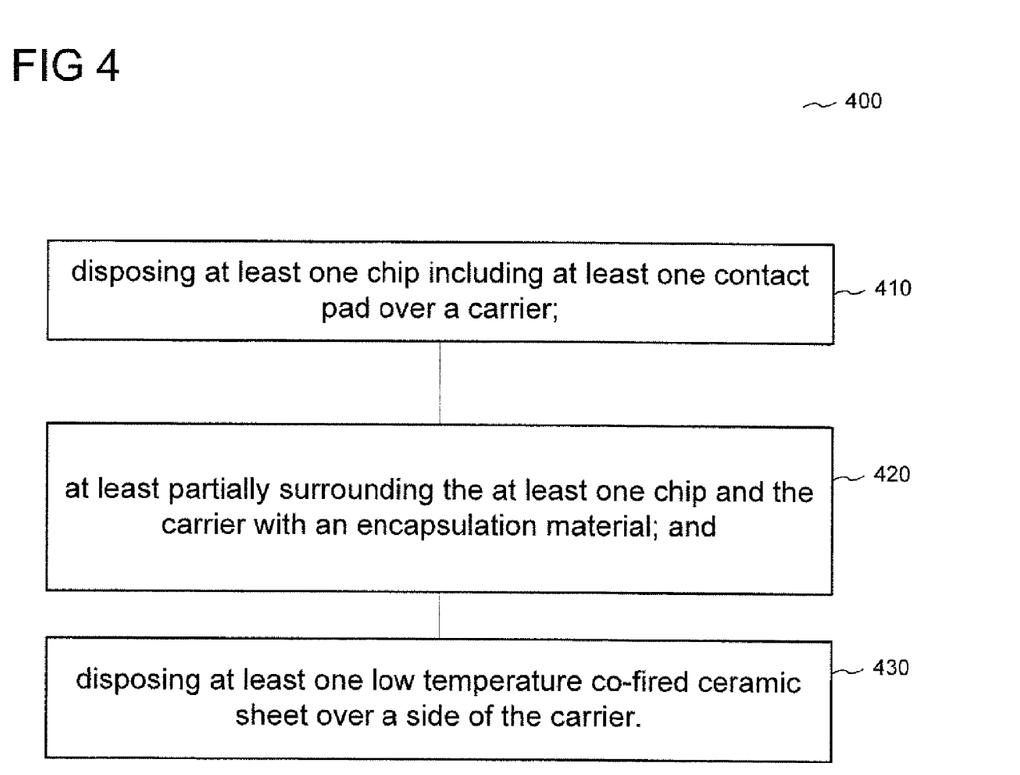
FIG. 4 shows a method for forming a chip arrangement according to an embodiment.

FIG. 4 shows method 400 for forming a chip arrangement according to an embodiment.

Method 400 may include:

disposing at least one chip including at least one contact pad over a carrier (in 410);

at least partially surrounding the at least one chip and the carrier with an encapsulation material (in 420); and disposing at least one low temperature co-fired ceramic sheet over a side of the carrier (in 430).

Various embodiments provide a chip arrangement, including: a carrier; at least one chip including at least one contact pad disposed over the carrier; an encapsulation material at least partially surrounding the at least one chip and the carrier; and at least one low temperature co-fired ceramic sheet disposed over a side of the carrier.

According to an embodiment, the carrier includes a lead frame material, the lead frame material including at least one from the following group of materials, the group of materials consisting of: copper, nickel, iron, copper alloy, nickel alloy, iron alloy.

According to an embodiment, the at least one chip includes at least one of a power semiconductor chip, a semiconductor logic chip and a semiconductor memory chip.

According to an embodiment, the power semiconductor chip includes at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

According to an embodiment, the semiconductor logic chip includes at least one semiconductor logic device from the group consisting of: an application specific integrated circuit chip, a driver, a controller, a sensor.

According to an embodiment, the encapsulation material includes at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

According to an embodiment, the encapsulation material is formed over the at least one chip and over one or more sidewalls of the at least one chip.

According to an embodiment, the encapsulation material is formed over the at least one chip and over one or more sidewalls of the carrier.

According to an embodiment, the at least one low temperature co-fired ceramic sheet is disposed on a carrier bottom side, the carrier bottom side being opposite to the side over which the chip is disposed.

According to an embodiment, the at least one low temperature co-fired ceramic sheet includes one or more low temperature co-fired ceramic sheets.

According to an embodiment, the at least one low temperature co-fired ceramic sheet is disposed on a side of the carrier, and wherein the at least one low temperature co-fired ceramic sheet physically contacts the encapsulation material.

According to an embodiment, the at least one low temperature co-fired ceramic sheet is disposed on a carrier bottom side, the carrier bottom side being opposite to the side over which the chip is disposed and on at least one side of the encapsulation material, wherein the at least one side of the encapsulation material is substantially adjacent to the carrier bottom side.

According to an embodiment, the at least one low temperature co-fired ceramic sheet is disposed on a carrier bottom side, the carrier bottom side being opposite to the side over which the chip is disposed and on at least one side of the encapsulation material, wherein the at least one side of the encapsulation material is substantially level with and abuts the carrier bottom side.

According to an embodiment, the at least one low temperature co-fired ceramic sheet includes ceramic particles, glass and metal.

According to an embodiment, the at least one low temperature co-fired ceramic sheet includes ceramic particles and glass particles sintered together, wherein the at least one low temperature co-fired ceramic sheet is sintered to the side of the carrier.

According to an embodiment, the glass includes alumoborosilicate glass.

According to an embodiment, the ceramic particles include aluminum oxide.

According to an embodiment, the metal includes at least one from the following group of materials, the group of materials consisting of: copper, silver, palladium, gold, platinum.

According to an embodiment, the chip arrangement further includes at least one further low temperature co-fired ceramic sheet disposed between the at least one chip and the carrier.

According to an embodiment, the chip arrangement further includes at least one wire electrically connected to the at least one contact pad, wherein the encapsulation material at least partially surrounds the at least one wire, and wherein the at least one wire is electrically connected to a lead frame.

Various embodiments provide a method for forming a chip arrangement, the method including: disposing at least one chip including at least one contact pad over a carrier; at least partially surrounding the at least one chip and the carrier with an encapsulation material; and disposing at least one low temperature co-fired ceramic sheet over a side of the carrier.

According to an embodiment, disposing at least one low temperature co-fired ceramic sheet over a side of the carrier includes arranging the at least one low temperature co-fired ceramic sheet over a side of the carrier and heating the at least one low temperature co-fired ceramic sheet wherein the at least one low temperature co-fired ceramic sheet is sintered to the carrier.

According to an embodiment, disposing at least one low temperature co-fired ceramic sheet over a side of the carrier includes arranging the at least one low temperature co-fired ceramic sheet including ceramic particles embedded in glass over a side of the carrier and heating the at least one low temperature co-fired ceramic sheet wherein the ceramic and the glass particles are sintered together.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip arrangement, comprising:
   a carrier;
   at least one chip comprising at least one contact pad disposed over the carrier;
   an encapsulation material at least partially surrounding the at least one chip and the carrier; and
   a plurality of low temperature co-fired ceramic sheets disposed over a bottom side of the carrier, the carrier bottom side being opposite to the side over which the chip is disposed and wherein each of the plurality of low temperature co-fired ceramic sheets has an entirely exposed surface facing away from the carrier, the exposed surfaces being coplanar with each other,
   wherein the encapsulation material is formed over the at least one chip and over one or more sidewalls of the carrier so that at least one bottom surface of the encapsulation material abuts and is co-planar with the bottom side of the carrier,
   wherein at least one of the plurality of low temperature co-fired ceramic sheets is disposed directly on a portion of the bottom side of the carrier and directly on a portion of the at least one bottom surface of the encapsulation material that abuts and is co-planar with the bottom side of the carrier.

2. The chip arrangement according to claim 1,
   wherein the carrier comprises a lead frame material, the lead frame material comprising at least one from the following group of materials, the group of materials consisting of: copper, nickel, iron, copper alloy, nickel alloy, iron alloy.

3. The chip arrangement according to claim 1,
   wherein the at least one chip comprises at least one of a power semiconductor chip, a semiconductor logic chip and a semiconductor memory chip.

4. The chip arrangement according to claim 3,
   wherein the power semiconductor chip comprises at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

5. The chip arrangement according to claim 3,
   wherein the semiconductor logic chip comprises at least one semiconductor logic device from the group consisting of: an application specific integrated circuit chip, a driver, a controller, a sensor.

6. The chip arrangement according to claim 1,
   wherein the encapsulation material comprises at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

7. The chip arrangement according to claim 1,
   wherein the encapsulation material is formed over one or more sidewalls of the at least one chip.

8. The chip arrangement according to claim 1,
   wherein the each of the plurality of low temperature co-fired ceramic sheets comprises ceramic particles, glass and metal.

9. The chip arrangement according to claim 8,
   wherein each of the plurality of one low temperature co-fired ceramic sheets comprises ceramic particles and glass particles sintered together, wherein each of the plurality of one low temperature co-fired ceramic sheet is sintered to the bottom side of the carrier.

10. The chip arrangement according to claim 8,
    wherein the glass comprises alumoborosilicate glass.

11. The chip arrangement according to claim 8,
    wherein the ceramic particles comprise aluminum oxide.

12. The chip arrangement according to claim 8,
    wherein the metal comprises at least one from the following group of materials, the group of materials consisting of: copper, silver, palladium, gold, platinum.

13. The chip arrangement according to claim 1, further comprising
    at least one further low temperature co-fired ceramic sheet disposed between the at least one chip and the carrier.

14. The chip arrangement according to claim 1, further comprising
    at least one wire electrically connected to the at least one contact pad, wherein the encapsulation material at least partially surrounds the at least one wire, and wherein the at least one wire is electrically connected to a lead frame.

15. The device of claim 1, wherein each of the plurality of low temperature co-fired ceramic sheets are separated from each other by a gap.

16. The device of claim 1, wherein each of the plurality of low temperature co-fired ceramic sheets are separated arranged substantially adjacent to each other.

17. The device of claim 1, wherein at least one edge of the at least one of the plurality of low temperature co-fired ceramic sheets disposed directly on a portion of the bottom side of the carrier and a portion of the at least one bottom surface of the encapsulation material is level with a sidewall of the encapsulation material.

* * * * *